United States Patent [19]

Barahia

[11] Patent Number: 5,737,210
[45] Date of Patent: Apr. 7, 1998

[54] BRIDGE RECTIFIER CONFIGURATION AND MOUNTING FOR SUPPLYING EXCITER CURRENT IN AN AC GENERATOR

[75] Inventor: Manoj M. Barahia, Manchester, Mo.

[73] Assignee: MagneTek, Inc., Nashville, Tenn.

[21] Appl. No.: 640,148

[22] Filed: Apr. 30, 1996

[51] Int. Cl.[6] .......................... H02M 1/00; H09K 11/00
[52] U.S. Cl. ........................................ 363/144; 310/68 D
[58] Field of Search ................................ 363/144, 145; 310/68 D

[56] References Cited

U.S. PATENT DOCUMENTS

| | | | |
|---|---|---|---|
| 4,321,664 | 3/1982 | Matthai | 363/145 X |
| 5,008,800 | 4/1991 | Klinkowstein | 363/144 X |
| 5,013,948 | 5/1991 | Tumpey et al. | 310/68 D |
| 5,043,641 | 8/1991 | Yockey | 310/68 D |

*Primary Examiner*—Peter S. Wong
*Assistant Examiner*—Y. J. Han
*Attorney, Agent, or Firm*—Waddey & Patterson; Mark J. Patterson

[57] ABSTRACT

A rectifier module assembly for a conventional three phase AC generator is formed into two crescent shaped rectifier modules so that the rectifier assembly can be mounted directly to the housing of the exciter rotor. The positive and negative rectifier modules are thermally conductive so that the exciter rotor itself can act as a heat sink for the rectifier module assembly. The rectifier module assembly occupies the space between and around the generator shaft and the exciter rotor windings.

10 Claims, 3 Drawing Sheets

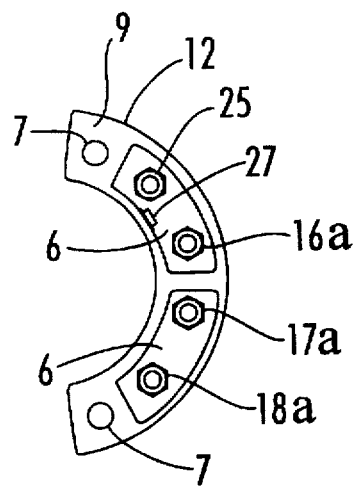
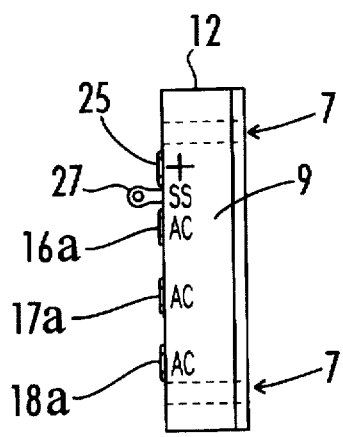
FIG. 3  FIG. 4
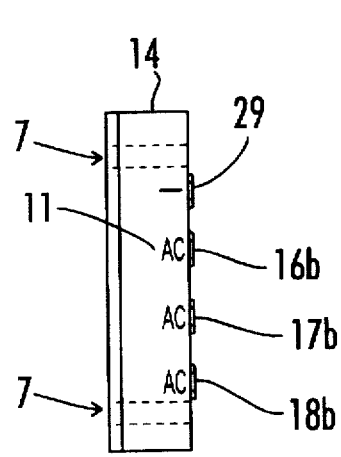
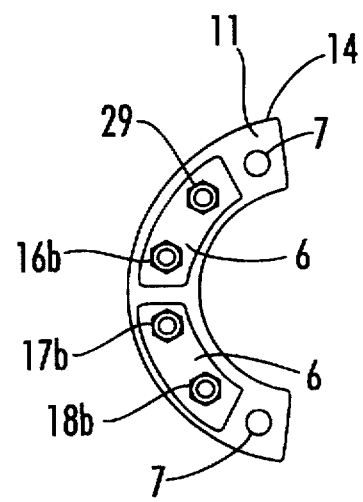
FIG. 6  FIG. 5

BRIDGE RECTIFIER CONFIGURATION AND MOUNTING FOR SUPPLYING EXCITER CURRENT IN AN AC GENERATOR

BACKGROUND OF THE INVENTION

The present invention relates generally to AC generators in which the DC exciter current for the main field of the generator is obtained from a power rectifier module mounted on or near the rotating shaft of the generator. More particularly, this invention pertains to a novel configuration and mounting of a bridge rectifier assembly used to supply the main field exciter current in a three phase AC generator.

Rotating field alternating current (AC) generators are well known in the art. They are used to produce an alternating current output voltage of either a single or three phase. In a typical three phase AC generator, the main field of the generator is excited by an exciter coil wound on an exciter rotor mounted on the generator shaft. The exciter field energizes the exciter armature or rotor. The output of the exciter rotor is then rectified in a rectifier circuit to produce a DC voltage. DC current from the rectifier output is used to excite the generator main field. The rotation of the generator main field then induces an AC voltage in the stator of the generator.

The rectifier circuits used in the prior art for converting the AC exciter output to a DC current for use in the generator's main field are a full wave bridge, with two diodes used for each phase. Further, such a full wave bridge rectifier circuit is generally configured in two ways. In one configuration, each of the six rectifiers are discrete devices combined with a surge protector. The six diodes are mounted on separate heat sinks which are then attached to the rotating shaft of the generator. The surge suppressor, such as a zener diode, is then connected across the DC output terminals of the rectifier circuit.

In a second configuration, the rectifier circuit includes six rectifier diode die and a surge suppressor mounted to a circuit board and then potted in a conventional manner to form an integral device. The power rectifier module is then mounted on a heat sink or directly to the generator shaft.

The typical prior art rectifier configuration and mounting arrangements suffer from a number of drawbacks. In the first configuration described above, each discrete rectifier diode requires a separate heat sink and therefore more wiring. The second configuration described above requires only one heat sink and therefore minimizes the wiring as well as the cost of the rectifier module.

However, even the second configuration can add significant cost to the AC generator as a whole. If the diode rectifier module is mounted outside the exciter rotor, it must be attached to a heat sink. The heat sink is then screwed into a metal washer mounted on the generator shaft, compressing the exciter core against a shaft shoulder. If the diode rectifier module is mounted inside the exciter rotor, the diode module would screw into the generator shaft. However, to allow for this type of attachment, the shaft must be machined to provide a flat area and tapped to accept the mounting screws. Machining a flat area and tapping a shaft is an expensive operation.

Finally, the rectifier module configurations and mounting techniques used in the prior art have required that the generator shaft be lengthened to accommodate the mounting of the module on the shaft and have added to the difficulty in balancing the rotor itself.

It is believed that others in the past have attempted to configure the six diodes of a rectifier module assembly in a circular arrangement around the shaft to minimize the space occupied. Applicant believes, however, that these attempts have been unsuccessful due in part to excessive heat generated in the diode assembly.

What is need, then, is a configuration and mounting for a rectifier assembly used to excite the main field of an AC generator which is lower in cost, which minimizes the length of the shaft, which eliminates machining operations on the shaft, and which makes it easier to balance the rotor.

SUMMARY OF THE INVENTION

In the new configuration and mounting of a rectifier module of the present invention, six diodes are electrically connected to form a three phase full wave bridge rectifier having a conventional topology. In a preferred embodiment, the diodes are separated into two groups of three, to form separate positive and negative rectifier modules. For each of the positive and negative rectifier modules, the diodes are mounted to a crescent shaped copper mounting plate. Wiring terminals are provided in the surface of the plates to provide connection points from the respective phase windings in the exciter rotor to common connection points of each rectifier diode pair, a well as for the positive and negative DC output terminals. Preferably, the positive rectifier module will include a solid state transient voltage suppresser, such as a zener diode.

The positive and negative rectifier modules are then attached by mounting screws directly to laminations of the exciter rotor, positioned between the shaft and the rotor windings. The properly positioned positive and negative rectifier modules form a central opening which surrounds the generator shaft. The exciter rotor laminations can then function as a heat sink, drawing destructive heat away from the rectifier module assembly.

BRIEF DESCRIPTION OF THE DRAWINGS

FIG. 3 is an enlarged plan view of the positive rectifier module of the rectifier module assembly of the present invention.

FIG. 4 is a side view of the positive rectifier module of FIG. 3.

FIG. 5 is an enlarged plan view of the negative rectifier module of the rectifier module assembly of the present invention.

FIG. 6 is a side view of the negative rectifier module of FIG. 5.

DESCRIPTION OF THE PREFERRED EMBODIMENT

Figure 7:
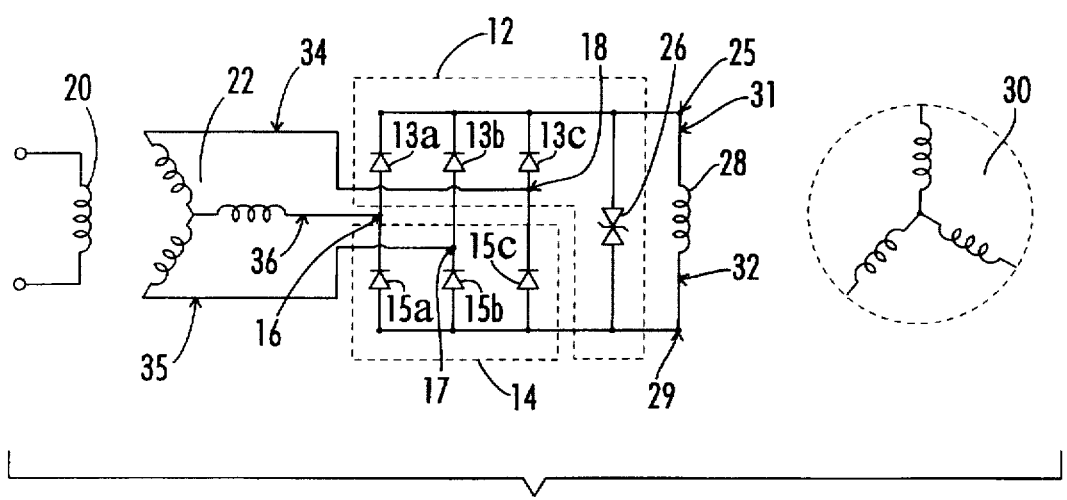
FIG. 7 is a electrical schematic diagram of the rectifier module assembly of the present invention in a three phase AC generator.

FIG. 7 is a schematic diagram of the electrical components of the rectifier module installed in conjunction with an otherwise conventional three phase AC generator. In a typical rotating field AC generator as shown, an exciter field winding 20 energizes an exciter armature or rotor 22. In FIG. 7, the three separate phase windings of the rotor 22 are connected in a conventional wye fashion with one end of each winding connected to a common neutral point. The other ends of each phase winding are connected to separate branches of a conventional full wave bridge rectifier circuit, with each branch comprising two series connected rectifier diodes. Therefore, as seen in FIG. 7, a first exciter rotor phase lead 34 is connected to the common junction point 18 between rectifier diodes 13c and 15c. In similar fashion, second exciter rotor phase lead 35 is connected to the junction point 17 between rectifier diodes 13b and 15b. Finally, a third exciter rotor phase lead 36 is connected to the common junction point 16 between rectifier diodes 13a and 15a.

Diodes 15a, 15b, and 15c, in a preferred embodiment of the invention, are physically mounted together in a negative rectifier module 14, with the cathodes of diodes 15a, 15b, and 15c connected to a common rectifier negative output terminal 29. Rectifier diodes 13a, 13b, and 13c are physically mounted together in a positive rectifier module 12, with their corresponding anodes connected to a common rectifier positive output terminal 25. In addition, a surge suppressor device 26, such as a zener diode, is physically mounted in and is a part of positive rectifier module 12 in a preferred embodiment of the rectifier module assembly, and is connected across rectifier positive and negative output terminals 25 and 29, respectively.

Accordingly, the rectifier module assembly, comprising positive rectifier module 12 and negative rectifier module 14, produces a DC output voltage across output terminals 25 and 29 to provide an exciter current in generator main field 28. This, in ram, induces a voltage in stator 30 of the generator, as is well known among those skilled in the art.

FIGS. 3, 4, 5, and 6 illustrate the mechanical configuration of the positive and negative rectifier modules 12 and 14, respectively, of the rectifier module assembly of this invention. Looking first at FIGS. 3 and 4, a mounting plate 9 is formed into a substantially crescent or half-cylindrical shape, preferably of tinned copper. Rectifier diodes 13a, 13b, and 13c (not shown) are mounted internal to mounting plate 9 in a conventional manner, with the anodes of diodes 13a, 13b, and 13c electrically connected to corresponding first, second, and third AC input terminals 16a, 17a, and 18a. Rectifier positive output terminal 25 is also mounted to mounting plate 9 of positive rectifier module 12. Insulators 6 electrically isolate the metallic end portions of terminals 16a, 17a, 18a, and 25 from mounting plate 9. In addition, terminal 27 is provided for making electrical connection to the negative terminal of surge protector 26, which is also internal to mounting plate 9 of positive rectifier module 12. Of course, internal to mounting plate 9, the anodes of rectifiers diodes 13a, 13b, and 13c are electrically connected together and brought out to rectifier positive output terminal 25. The cathodes of diodes 13a, 13b, and 13c are respectively connected to rectifier input terminals 16a, 17a, and 18a on mounting plate 9. Finally, mounting holes 7 are provided so that positive rectifier module 12 can be screwed or bolted to the exciter rotor housing as will be described below.

Looking now at FIGS. 5 and 6, one can see that the physical configuration of negative rectifier module 14 is quite similar. Mounting plate 11 forms a mirror image of mounting plate 9 of the positive rectifier module 12 so that when positive and negative rectifier modules 12 and 14 are arranged together, they form substantially a circular or cylindrical shape. First, second, and third rectifier AC input terminals 16b, 17b, and 18b are provided at the top or outer surface of mounting plate 11 to provide for wiring connection to the anodes of internally mounted rectifier diodes 15a, 15b, and 15c. Rectifier negative output terminal 29 is also mounted through the mounting plate 11. Insulators 6 electrically isolate AC input terminals 16b, 17b, 18b, and output terminal 29 from the electrically conductive mounting plate 11, again preferably made of tinned copper. Internal to mounting plate 11 are the actual rectifier diodes 15a, 15b, and 15c with their respective cathodes electrically connected to each other and to negative output terminal 29. Mounting holes 7 through mounting plate 11 provide a means for attaching negative rectifier module 14 to the exciter rotor housing as described below.

Figure 1:
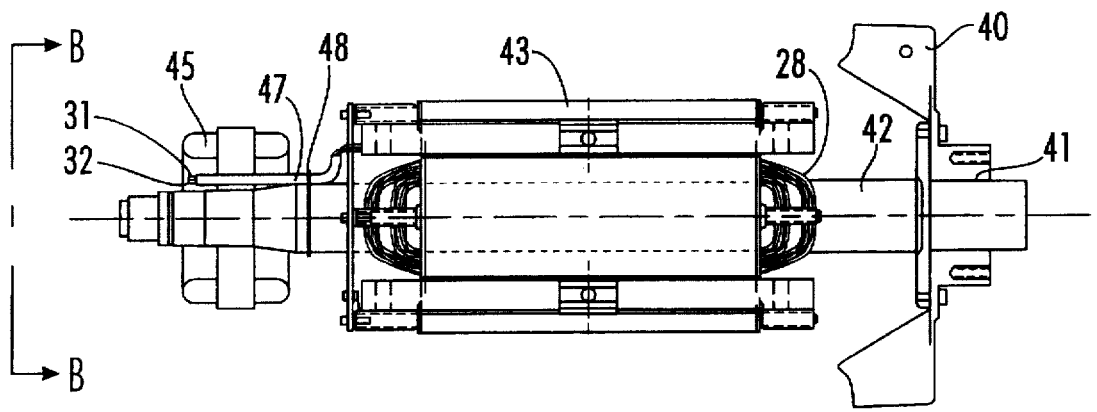
FIG. 1 is a side cross sectional view of a rotor and shaft assembly used in a three-phase AC generator, showing the exciter rotor positioned around the generator shaft with the exciter stator removed.
Figure 2:
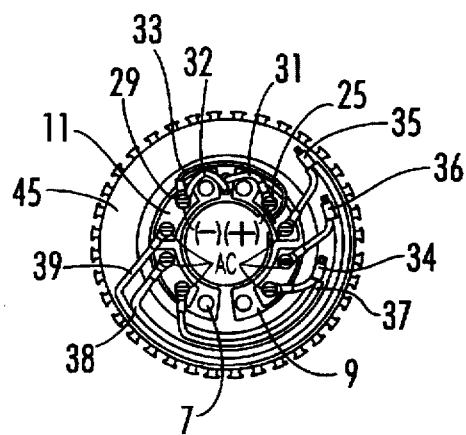
FIG. 2 is an end view of the rotor and shaft assembly of FIG. 1, taken along line B—B, showing the rectifier module assembly of the present invention mounted to the exciter rotor housing.

FIGS. 1 and 2 show the novel installation and mounting of the rectifier module assembly of this invention to an otherwise conventional AC generator. Shaft 42 of the generator is supported within a generator housing or frame (not shown) with a cooling fan partially shown at 40, and supported by shaft bearing 41. Also shown is a conventional generator rotor assembly 43. As is known in the art, but not shown in FIG. 1, the generator stator assembly (schematically shown as 30 on FIG. 7) would surround rotor assembly 43. The generator rotor assembly 43 will include a series of windings around the rotor core which forms the generator main field 28. At the opposite end of the shaft 42 is the generator exciter. In FIG. 1, for purposes of clarity, only the exciter rotor housing 45 is shown. In addition, a wiring harness 47 houses main field positive and negative leads 31 and 32 so that the main field 28 can be electrically connected to the positive and negative output terminals 25 and 29 of the rectifier module assembly. A cable tie 48 or other conventional means of attachment should be used to secure wiring harness 47 to shaft 42.

FIG. 2 is an end view of the AC generator partial assembly of FIG. 1, looking from the exciter end of the shaft and further showing the exciter rotor and installation of the rectifier module assembly. The positive and negative rectifier modules 12 and 14 have been screwed to the side or end of the exciter rotor housing 45 or directly to the exciter rotor laminations. It is important that this connection be made so that there is good thermal conduction between the positive and negative rectifier modules 12 and 14 and the metallic portions of the rotor. This allows the exciter rotor to act as a heat sink for the rectifier module assembly. To improve heat transfer from the rectifier module assembly to the rotor housing, a thermally conductive paste can be used between the lower surface of the mounting plate 11 and the housing 45 to bridge any air gaps left by imperfections in the metal surfaces. A paste known as CHO-THERM 1641 from Chomerics, Inc., Wolburn, Mass. will work in this application.

A slotted opening should be machined or left in the exciter rotor housing so that wiring harness 47 can pass through. As seen on FIG. 2, this allows the main field positive and negative leads 31 and 32 to pass through the exciter rotor housing 45 and be connected as shown to rectifier positive and negative output terminals 25 and 29.

Wiring lead 33 connects the surge protector terminal 27 to rectifier module assembly negative output terminal 29. First, second, and third exciter rotor phase leads 34, 35, and 36 are mechanically and electrically connected as shown to AC input terminals 16a, 16b, 17a, 17b, 18a, and 18b, making complete the connections between the exciter rotor and the individual diodes of the full wave bridge. Connector leads 37, 38, and 39 complete the electrical connection between the cathodes of diodes 13a, 13b, and 13c to corresponding anodes of diodes 15a, 15b, and 15c to complete the bridge rectifier circuit.

Therefore, the crescent shaped configuration of the individual rectifier diode modules 12 and 14 allow for the rectifier module assembly to be mounted directly to the exciter rotor housing 45 between the shaft 42 and the exciter rotor windings. This produces several beneficial consequences, including: reducing the overall length of the generator shaft 42; eliminating the need for using a separate heat sink for the rectifier assembly; eliminating extra machining steps on the shaft 42; and making it easier to balance the rotor.

Thus, although there have been described particular embodiments of the present invention of an improved bridge rectifier configuration and mounting for supplying exciter current in an AC generator, it is not intended that such references be construed as limitations upon the scope of this invention except as set forth in the following claims.

What I claim is:

1. A rectifier module assembly for use in conjunction with a rotating field AC generator, the generator having a shaft, a main rotor mounted on the shaft, a main field wound on the main rotor, and a exciter rotor including an exciter coil wound on the rotor, the exciter rotor mounted on the shaft, comprising:

a. a first rectifier module including a first thermally conductive mounting plate formed into a crescent shaped, a first rectifier circuit attached to the first mounting plate, at least one rectifier input terminal attached to the first mounting plate, and a reciter positive output terminal attached to the first, mounting plate;

b. a second rectifier module including a second thermally conductive mounting plate formed into crescent shape, a second rectifier circuit attached to the second mounting plate, at least one rectifier input terminal attached to the second mounting plate, and a rectifier negative output terminal attached to the second mounting plate;

c. first circuit connecting means to electrically connect the first and second rectifier circuits to each other, second circuit connecting means to connect the positive and negative rectifier output terminals to the generator main field, and third circuit connecting means to connect the rectifier input terminals to the exciter coil; and d. the first and second mounting plates mechanically attached to and in direct thermal contact with the exciter rotor and arranged in opposed positions to form a substantially circular assembly around the shaft whereby the exciter rotor acts as a heat sink for the rectifier module assembly.

2. The rectifier module assembly of claim 1 wherein the exciter coil has three separate phase windings and the first rectifier circuit comprises first, second, and third diodes arranged in circuit so that anodes of the first, second, and third diodes are connected to the rectifier positive output terminal, and the second rectifier circuit comprises fourth, fifth, and sixth diodes arranged in circuit so that cathodes of the fourth, fifth, and sixth diodes are connected to the rectifier negative output terminal, all of the diodes together forming a full wave bridge rectifier circuit for each of the phase windings of the exciter coil.

3. The rectifier module of claim 2 wherein the first rectifier module further comprises a voltage suppressor means for suppressing transient voltages, the voltage suppressor means attached to the first mounting plate and electrically connected across the rectifier positive and negative output terminals.

4. The rectifier module assembly of claim 1 wherein the first and second mounting plates are made of copper.

5. The rectifier module assembly of claim 4 further comprising insulating means which electrically isolate the rectifier input and output terminals from the first and second mounting plates.

6. The rectifier module assembly of claim 1 wherein the assembly is mounted between the generator shaft and the exciter coil.

7. A rectifier module for rectifying a polyphase AC excitation signal from a coil wound on an exciter rotor attached to the shaft of a polyphase AC generator to provide a DC excitation current to a main field of the generator comprising:

a. a cylindrical mounting plate formed of two opposed crescent-shaped half-plates and including mounting means to attach the module to the exciter rotor and around the shaft so that the mounting plate is between the shaft and the coil on the exciter rotor and such that a thermally conductive bond is formed directly between the rectifier module and the exciter rotor; and b. a rectifier circuit internal to the mounting plate and electrically connected to rectifier output terminals and rectifier input terminals attached to and external to the mounting plate.

8. In an AC generator having a shaft, a main field wound on a main rotor attached to the shaft, a stator, an exciter coil wound on an exciter rotor attached to the shaft, an exciter field, and a rectifier circuit for providing a DC exciter current to the main field from an excitation signal generated in the exciter coil, the improvement comprising mounting the rectifier circuit inside a rectifier module, the rectifier module comprising a thermally conductive cylinder comprising first and second opposed thermally conductive mounting plates, the cylinder attached directly to the exciter rotor and around the shaft, whereby heat generated by the rectifier circuit is transmitted through the cylinder and into the exciter rotor.

9. The improved AC generator of claim 8 further comprising wiring harness means to electrically connect the main field to the rectifier module, the wiring harness means secured to the shaft and passing through an opening in the exciter rotor.

10. The improved AC generator of claim 8, the rectifier circuit comprising a three-phase full wave bridge circuit having six diodes with three diodes arranged in circuit inside the first mounting plate and three diodes arranged in circuit inside the second mounting plate.

* * * * *